United States Patent
Kubota

(10) Patent No.: US 9,934,947 B2
(45) Date of Patent: Apr. 3, 2018

(54) PLASMA PROCESSING APPARATUS AND WAVEFORM CORRECTION METHOD

(71) Applicant: TOKYO ELECTRON LIMITED, Tokyo (JP)

(72) Inventor: Shinji Kubota, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/626,502

(22) Filed: Jun. 19, 2017

(65) Prior Publication Data

US 2017/0365445 A1   Dec. 21, 2017

(30) Foreign Application Priority Data

Jun. 20, 2016   (JP) .................................. 2016-121596

(51) Int. Cl.
*H01J 37/32*   (2006.01)

(52) U.S. Cl.
CPC .... *H01J 37/3299* (2013.01); *H01J 37/32055* (2013.01); *H01J 37/32715* (2013.01); *H01J 2237/327* (2013.01); *H01J 2237/334* (2013.01)

(58) Field of Classification Search
CPC ............. H01J 37/3299; H01J 37/32055; H01J 37/32715
USPC .................................................. 315/111.21
See application file for complete search history.

(56) References Cited

U.S. PATENT DOCUMENTS

| 6,252,354 | B1* | 6/2001 | Collins ................. H01J 37/321 |
| 8,835,869 | B2* | 9/2014 | Yevtukhov .............. H01J 27/18 |
| | | | 250/396 ML |
| 9,798,256 | B2* | 10/2017 | Kosaki ................. G03G 9/0806 |
| 2003/0082662 | A1* | 5/2003 | Nakashima ........ G01N 15/1459 |
| | | | 435/13 |
| 2003/0117140 | A1* | 6/2003 | Belt ................... G01R 33/3415 |
| | | | 324/322 |

(Continued)

FOREIGN PATENT DOCUMENTS

| EP | 0 840 350 A2 | 5/1998 |
| JP | 10-241895 A | 9/1998 |
| JP | 2005-203444 A | 7/2005 |

*Primary Examiner* — Douglas W Owens
*Assistant Examiner* — Syed M Kaiser
(74) *Attorney, Agent, or Firm* — Rothwell, Figg, Ernst & Manbeck, P.C.

(57) ABSTRACT

A plasma processing apparatus includes an electrode to which a high frequency for plasma generation is applied and which serves as a mounting table for a target object. The plasma processing apparatus further includes a high frequency generation unit, a distortion component extraction unit and a waveform correction unit. The high frequency generation unit generates the high frequency by using waveform data including a set frequency component having a predetermined frequency. The distortion component extraction unit extracts a distortion component given to the high frequency in a path for transmitting the high frequency generated by the high frequency generation unit to the electrode. The waveform correction unit corrects the waveform data by combining an antiphase component obtained by inverting a phase of the distortion component and the set frequency component of the waveform data used for generation of the high frequency.

6 Claims, 9 Drawing Sheets

(56) References Cited

U.S. PATENT DOCUMENTS

| | | | |
|---|---|---|---|
| 2011/0061814 A1* | 3/2011 | Ikeda | H01J 37/32192 156/345.41 |
| 2012/0273773 A1* | 11/2012 | Ieda | H01L 27/105 257/43 |
| 2015/0005607 A1* | 1/2015 | Cui | A61B 5/04001 600/372 |
| 2016/0378593 A1* | 12/2016 | Takeda | G06F 12/0811 714/755 |

* cited by examiner

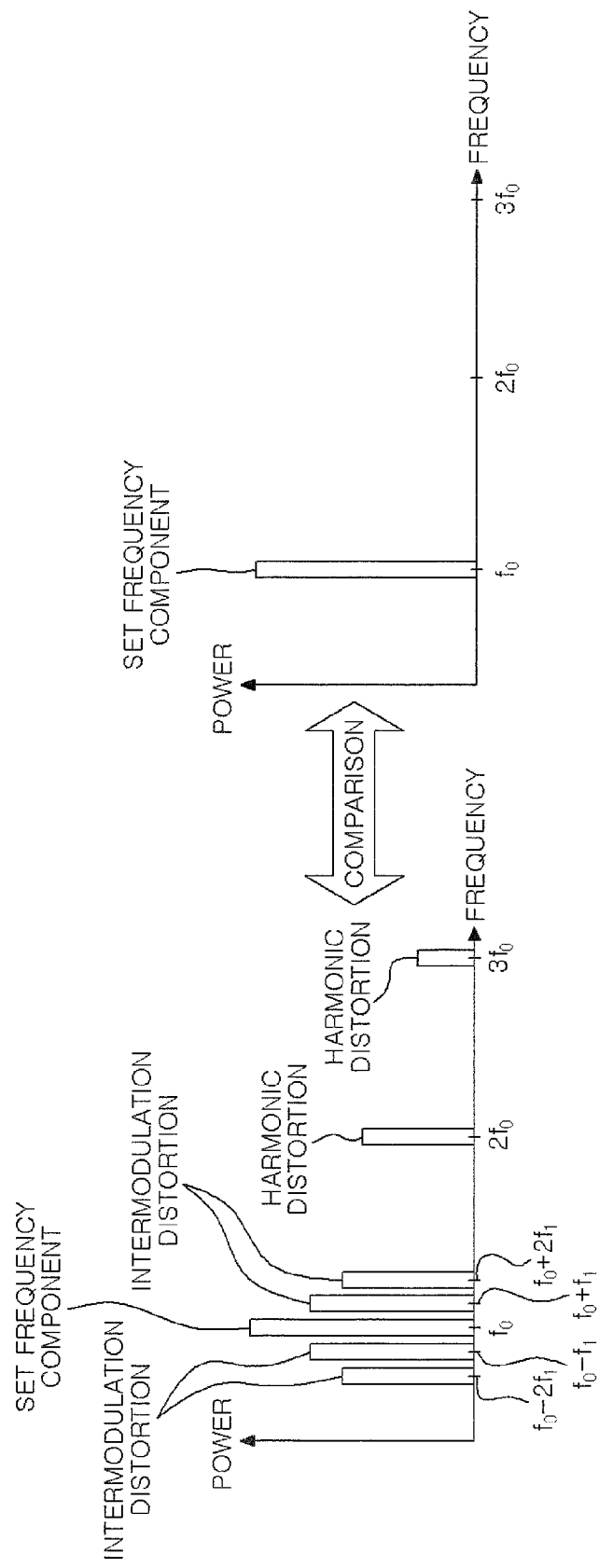

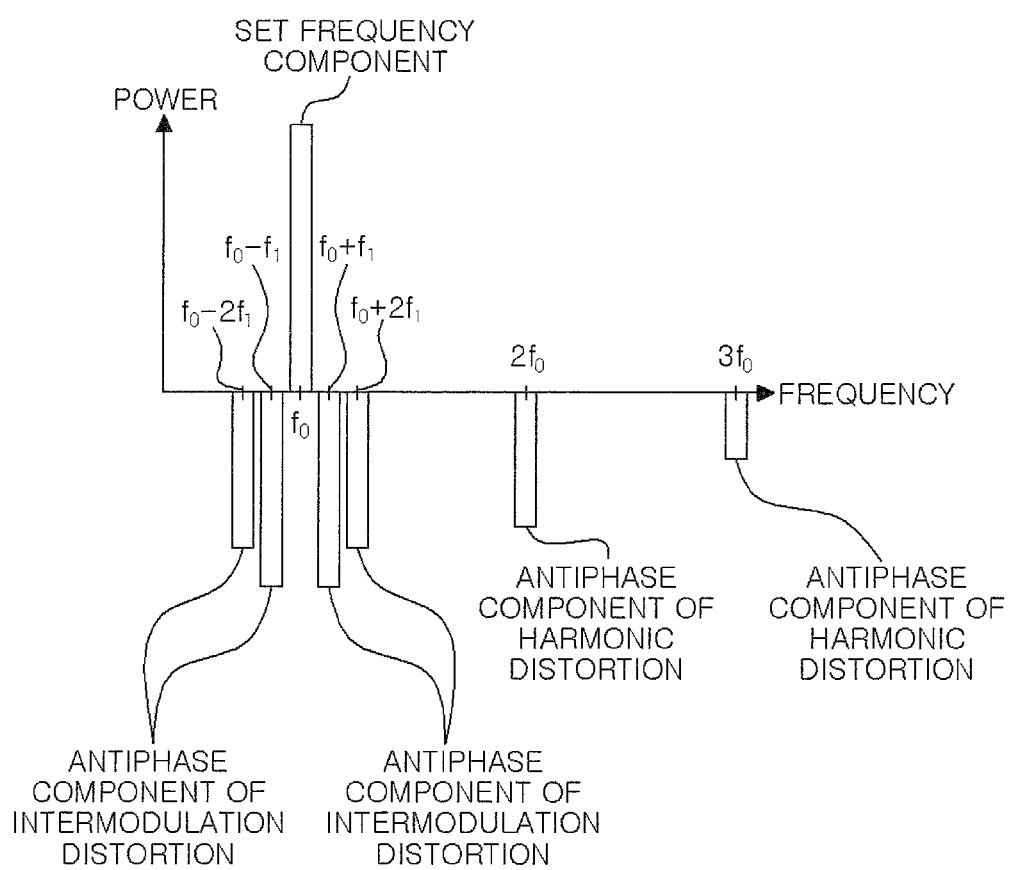

PLASMA PROCESSING APPARATUS AND WAVEFORM CORRECTION METHOD

CROSS-REFERENCE TO RELATED APPLICATIONS

This application claims priority to Japanese Patent Application No. 2016-121596 filed on Jun. 20, 2016, the entire contents of which are incorporated herein by reference.

FIELD OF THE INVENTION

The disclosure relates to a plasma processing apparatus and a waveform correction method.

BACKGROUND OF THE INVENTION

Conventionally, there is known a plasma processing apparatus for performing a plasma etching process on a target object by using a plasma. In the plasma processing apparatus, a plasma is generated in a processing chamber by applying a high frequency for plasma generation to an electrode provided in the processing chamber and serving as a mounting table on which a target object is mounted. The plasma etching process is performed on a surface of the target object by ions or radicals in the plasma.

However, in the plasma processing apparatus, a distortion component may be given to the high frequency for plasma generation on a path for transmitting the high frequency for plasma generation to the electrode. For example, a distortion component referred to as harmonic distortion is generated at a frequency that is an integral multiple of a frequency of the high frequency for plasma generation due to non-linear characteristics or minute impedance changes in elements such as a cable for connecting the electrode and the high frequency power source for generating a high frequency for plasma generation, and the like. When the harmonic distortion occurs, distortion of a waveform of the high frequency for plasma generation which is applied to the electrode (hereinafter, referred to as "waveform distortion") occurs. The uniformity of the plasma deteriorates due to the waveform distortion of the high frequency. Therefore, the uniformity of an etching rate of the target object deteriorates.

There is known a conventional technique for removing harmonic distortion by applying a specific impedance of an impedance element provided on a path for transmitting a high frequency for plasma generation to the electrode to thereby suppress the waveform distortion of the high frequency (see, e.g., Japanese Patent Application Publication No. 2005-203444 and Japanese Patent Application Publication No. H10-241895).

In the conventional technique using an impedance element, it is possible to suppress deterioration of the uniformity of the etching rate which is caused by the waveform distortion of the high frequency applied to the electrode, whereas it is difficult to reduce a difference in the etching rate between plasma processing apparatuses.

In other words, a state of the path on which the impedance element is provided (e.g., a state of a cable connecting an electrode and a high frequency power supply for generating a high frequency for plasma generation or the like) varies depending on plasma processing apparatuses, so that a magnitude of harmonic distortion occurring on the path varies depending on the plasma processing apparatuses. When the magnitude of the harmonic distortion varies depending on the plasma processing apparatuses, it is difficult to sufficiently remove the harmonic distortion by using an impedance element because an impedance of the impedance element is fixed, and large harmonic distortion may remain depending on the plasma processing apparatuses. Accordingly, in case that the impedance element is simply used, the magnitudes of the remaining harmonic distortion become different between the plasma processing apparatuses. Therefore, the magnitude of the waveform distortion of the high frequency applied to the electrode also varies depending on plasma processing apparatuses. The difference in the waveform distortion between plasma processing apparatuses causes a difference in plasma uniformity between plasma processing apparatuses. As a result, the difference in the etching rate between plasma processing apparatuses is increased.

SUMMARY OF THE INVENTION

In view of the above, the disclosure provides a plasma processing apparatus capable of suppressing deterioration of the uniformity of the etching rate which is caused by the waveform distortion of the high frequency applied to the electrode and reducing the difference in the etching rate between plasma processing apparatuses.

In accordance with an aspect, there is provided a plasma processing apparatus including an electrode to which a high frequency for plasma generation is applied and which serves as a mounting table for a target object. The plasma processing apparatus further includes a high frequency generation unit, a distortion component extraction unit and a waveform correction unit. The high frequency generation unit generates the high frequency by using waveform data including a set frequency component having a predetermined frequency. The distortion component extraction unit extracts a distortion component given to the high frequency in a path for transmitting the high frequency generated by the high frequency generation unit to the electrode. The waveform correction unit corrects the waveform data by combining an antiphase component obtained by inverting a phase of the distortion component and the set frequency component of the waveform data used for generation of the high frequency.

In accordance with one aspect of the plasma processing apparatus, it is possible to suppress deterioration of the uniformity of the etching rate which is caused by the waveform distortion of the high frequency applied to the electrode and to reduce the difference in the etching rate between plasma processing apparatuses.

BRIEF DESCRIPTION OF THE DRAWINGS

The objects and features of the disclosure will become apparent from the following description of embodiments, given in conjunction with the accompanying drawings, in which:

FIGS. 2A and 2B explain exemplary processes of a distortion component extraction unit and a waveform correction unit in the first embodiment;

DETAILED DESCRIPTION OF THE EMBODIMENTS

Figure 1:
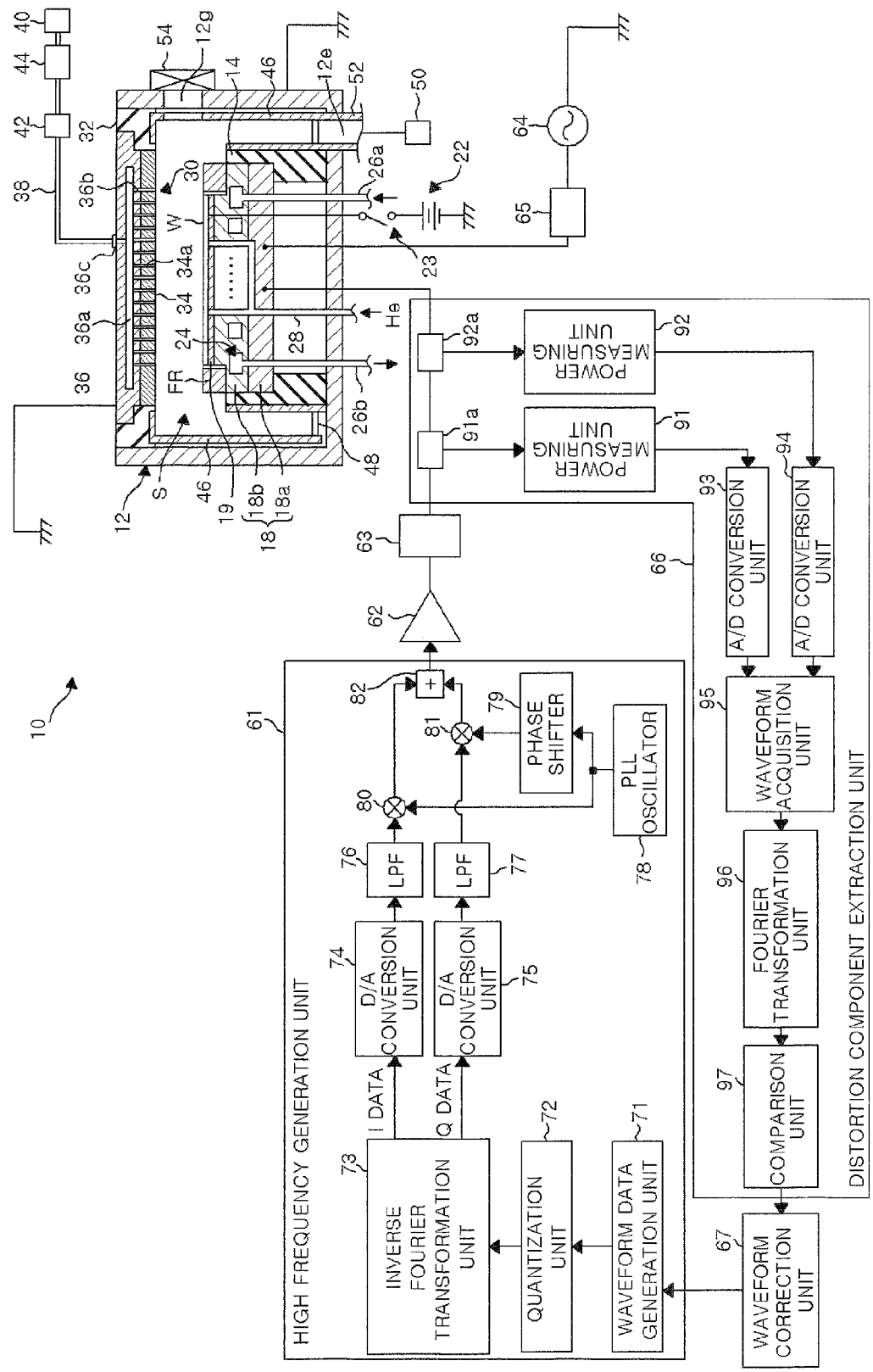
FIG. 1 shows a configuration example of a plasma processing apparatus according to a first embodiment.

Hereinafter, embodiments of a plasma processing apparatus and a waveform correction method will be described in detail with respect to the accompanying drawings. Like reference numerals will be used for like or corresponding prats throughout the drawings. The present disclosure is not limited to the following embodiment. The following embodiments can be appropriately combined unless the combination causes any contradiction.

First Embodiment

FIG. 1 shows a configuration example of a plasma processing apparatus 10 according to a first embodiment. The plasma processing apparatus 10 shown in FIG. 1 is configured as a plasma processing apparatus using a CCP (Capacitively Coupled Plasma). The plasma processing apparatus 10 includes a substantially cylindrical processing chamber 12. An inner wall surface of the processing chamber is made of, e.g., anodically oxidized aluminum. The processing chamber 12 is frame grounded.

A substantially cylindrical support 14 is provided on a bottom portion of the processing chamber 12. The support is made of, e.g., an insulating material. In the processing chamber 12, the support 14 extends vertically from the bottom portion of the processing chamber 12. A lower electrode 18 serving as a mounting table for a wafer W is provided in the processing chamber 12. The lower electrode 18 is supported by the support 14.

The wafer W as a target object is held on a top surface of the lower electrode 18. The lower electrode 18 includes a first and a second plate 18a and 18b. The first and the second plate 18a and 18b are made of a metal, e.g., aluminum, and have a substantially disc shape. The second plate 18b is provided on the first plate 18a and electrically connected to the first plate 18a.

An electrostatic chuck 19 is provided on the second plate 18b of the lower electrode 18. The electrostatic chuck 19 has a structure in which an electrode made of a conductive film is interposed between two insulating sheets or two insulating layers. A DC power supply 22 is electrically connected to the electrode of the electrostatic chuck 19 via a switch 23. The wafer W is attracted and held on the electrostatic chuck 19 by an electrostatic force such as a Coulomb force or the like generated by a DC voltage from the DC power supply 22. Accordingly, the wafer W can be held on the electrostatic chuck 19.

A focus ring FR is provided on a peripheral portion of the second plate 18b of the lower electrode 18 to surround an edge of the wafer W and the electrostatic chuck 19. The focus ring FR is provided to improve etching uniformity. The focus ring FR is made of a material appropriately selected depending on types of films to be etched. For example, the focus ring FR may be made of quartz.

A coolant channel 24 is provided in the second plate 18b. The coolant channel 24 constitutes a temperature control mechanism. A coolant is supplied from a chiller unit provided at an outside of the processing chamber 12 to the coolant channel 24 through a line 26a. The coolant supplied to the coolant channel 24 returns to the chiller unit through a line 26b. The coolant is supplied to and circulated in the coolant channel 24. By controlling a temperature of the coolant, a temperature of the wafer W held on the electrostatic chuck 19 is controlled.

The plasma processing apparatus 10 includes a gas supply line 28. The gas supply line 28 supplies a heat transfer gas, e.g., He gas, from a heat transfer gas supply unit to a gap between the top surface of the electrostatic chuck 19 and a backside of the wafer W.

The plasma processing apparatus 10 further includes an upper electrode 30. The upper electrode 30 is provided above the lower electrode 18 to face the lower electrode 18. The lower electrode 18 and the upper electrode 30 are substantially parallel to each other. A processing space S for performing plasma processing on the wafer W is provided between the upper electrode 30 and the lower electrode 18.

The upper electrode 30 is held on an upper portion of the processing chamber 12 through an insulating shield member 32. Further, the upper electrode 30 is connected to GND. In the first embodiment, a vertical distance from a top surface of the lower electrode 18, i.e., a wafer mounting surface, to the upper electrode 30 is variable. The upper electrode 30 may include an electrode plate 34 and an electrode plate holder 36. The electrode plate 34 faces the processing space S and has a plurality of gas injection holes 34a. In the first embodiment, the electrode plate 34 is made of silicon.

The electrode plate holder 36 detachably holds the electrode plate 34 and may be made of a conductive material, e.g., aluminum. The electrode plate holder 36 may have a water cooling structure. A gas diffusion space 36a is formed in the electrode plate holder 36. A plurality of gas holes 36b communicating with the gas injection holes 34a extends downward from the gas diffusion space 36a. A gas inlet port 36c for introducing a processing gas into the gas diffusion space 36a is formed at the electrode plate holder 36. A gas supply line 38 is connected to the gas inlet port 36c.

A gas source group 40 is connected to the gas supply line 38 through a valve group 42 and a flow rate controller group 44. The gas source group 40 includes a plurality of gas sources such as a source of a fluorocarbon gas, a source of a rare gas, a source of oxygen ($O_2$) gas, and the like. The fluorocarbon gas contains at least one of $C_4F_6$ gas and $C_4F_8$ gas, for example. The rare gas contains at least one of various rare gases such as Ar gas, He gas and the like.

The valve group 42 includes a plurality of valves. The flow rate controller group 44 includes a plurality of flow rate controllers such as mass flow controllers. The gas sources of the gas source group 40 are connected to the gas supply line 38 through corresponding valves of the valve group 42 and corresponding flow rate controllers of the flow rate controller group 44.

In the plasma processing apparatus 10, a deposit shield 46 is detachably provided along an inner wall of the processing chamber 12. The deposit shield 46 is also provided at an outer periphery of the support 14. The deposit shield 46 prevents etching by-products (deposits) from being adhered to the processing chamber 12. The deposit shield 46 may be formed by coating aluminum with ceramic such as $Y_2O_3$ or the like.

At a lower portion of the processing chamber 12, a gas exhaust plate 48 is provided between the support 14 and a sidewall of the processing chamber 12. The gas exhaust plate 48 may be formed by coating aluminum with ceramic, e.g., $Y_2O_3$ or the like. A gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, so that a pressure in the space S in the processing chamber 12 can be decreased to a predetermined vacuum level. A loading/unloading port 12g for the wafer W is provided at the sidewall of the processing chamber 12. The loading/unloading port 12g can be opened and closed by a gate valve 54.

As shown in FIG. 1, the plasma processing apparatus 10 further includes a high frequency generation unit 61 and a high frequency power supply 64.

The high frequency generation unit 61 generates a high frequency for plasma generation by using waveform data containing a set frequency component having a predetermined frequency. The high frequency generation unit 61 generates a high frequency of 60 MHz by using the waveform data including a set frequency component having a frequency of 60 MHz, for example. The high frequency generation unit 61 is connected to the lower electrode 18 through an amplifier 62 and a matching unit 63. The amplifier 62 amplifies the high frequency generated by the high frequency generation unit 61 and supplies the amplified high frequency to the lower electrode 18 through the matching unit 63. The matching unit 63 matches an output impedance of the high frequency generation unit 61 with an input impedance of a load side (i.e., the lower electrode 18 side). A path between the high frequency generation unit 61 and the lower electrode 18 is a path for transmitting the high frequency for plasma generation which is generated by the high frequency generation unit 61 to the lower electrode 18. Elements, e.g., a cable connecting the amplifier 62, the matching unit 63, the high frequency generation unit 61 and the lower electrode 18, and the like are provided on the path. A distortion component referred to as "harmonic wave distortion" occurs at a frequency that is an integer multiple of the high frequency for plasma generation due to minute non-linear characteristics or discontinuity points of the impedance in such elements. The harmonic wave distortion is added to the high frequency for plasma generation on the path between the high frequency generation unit 61 and the lower electrode 18. The harmonic wave distortion is an example of the distortion component occurring on the path for transmitting to the lower electrode 18 the high frequency for plasma generation which is generated by the high frequency generation unit 61.

As shown in FIG. 1, the high frequency generation unit 61 includes a waveform data generation unit 71, a quantization unit 72, an inverse Fourier transformation unit 73, D/A (digital-to-analog) conversion units 74 and 75, and LPFs (Low Pass Filters) 76 and 77. The high frequency generation unit 61 further includes a PLL (Phase Locked Loop) oscillator 78, a phase shifter 79, multipliers 80 and 81, and an adder 82.

The waveform data generation unit 71 generates waveform data. For example, the waveform data generation unit 71 generates waveform data including a set frequency component having a predetermined frequency. Further, the waveform data generation unit 71 outputs the generated waveform data to the quantization unit 72. The waveform data generated by the waveform data generation unit 71, i.e., the waveform data used for generation of a first high frequency in the high frequency generation unit 61, is corrected by a waveform correction unit 67 to be described later.

The quantization unit 72 quantizes the waveform data inputted from the waveform data generation unit 71. The inverse Fourier transformation unit 73 performs inverse Fourier transformation of the waveform data quantized by the quantization unit 72, thereby separating I data (In-Phase component) and Q data (Quadrature component) of the waveform data. The I data and the Q data of the waveform data separated by the inverse Fourier transformation unit 73 are D/A converted by the D/A conversion units 74 and 75 and inputted into the multipliers 80 and 81 through the LPFs 76 and 77.

The PLL oscillator 78 generates a reference transfer wave and outputs the generated reference transfer wave to the phase shifter 79 and the multiplier 80. The phase shifter 79 shifts the phase of the reference transfer wave inputted from the PLL oscillator 78 by 90° and outputs the reference transfer wave of which phase has been shifted by 90° to the multiplier 81. The multiplier 80 multiplies the I data inputted from the LFP 76 by the reference transfer wave inputted from the PLL oscillator 78. The multiplier 81 multiplies the Q data inputted from the LPF 77 by the reference transfer wave inputted from the phase shifter 79. The adder 82 adds the multiplication result of the multiplier 80 and that of the multiplier 81, thereby generating a high frequency for plasma generation and outputting the generated high frequency to the multiplier 62.

The high frequency power supply 64 generates a high frequency for attracting ions to the wafer W. The high frequency power supply 64 generates a high frequency lower than the high frequency generated by the high frequency generation unit 61. The high frequency power supply 64 generates a high frequency power with a high frequency of, e.g., 600 kHz. In the following description, the high frequency generated by the high frequency power supply 64 is referred to as "bias high frequency" in order to distinguish the high frequency generated by the high frequency power supply 64 and the high frequency generated by the high frequency power supply 61. The high frequency power supply 64 is connected to the lower electrode 18. A matching unit 65 matches an output impedance of the high frequency power supply 64 and an input impedance of a load side (lower electrode 18 side). The high frequency power supply 64 is connected to the lower electrode 18 as in the case of the high frequency generation unit 61. Therefore, when the bias high frequency different from the high frequency generated by the high frequency generation unit 61 is applied to the lower electrode 18, a part of the bias high frequency may leak to the path between the high frequency generation unit 61 and the lower electrode 18. Due to interference between the high frequency for plasma generation and the bias high frequency leaked to the path between the high frequency generation unit 61 and the lower electrode 18, a distortion component referred to as "intermodulation distortion" is generated near the high frequency for plasma generation. The harmonic wave distortion is added to the high frequency for plasma generation on the path between the high frequency generation unit 61 and the lower electrode 18. The intermodulation distortion is an example of the distortion component generated on the path for transmitting the high frequency generated by the high frequency generation unit 61 to the lower electrode 18.

As shown in FIG. 1, the plasma processing apparatus 10 further includes a distortion component extraction unit 66 and a waveform correction unit 67.

The distortion component extraction unit 66 extracts the distortion component given to the high frequency for plasma generation on the path for transmitting the high frequency for plasma generation which is generated by the high frequency generation unit 61 to the lower electrode 18. The distortion component extracted by the distortion component extraction unit 66 includes, e.g., the harmonic wave distortion and the intermodulation distortion.

As shown in FIG. 1, the distortion component extraction unit 66 includes power measuring units 91 and 92, A/D (analog-to-digital) conversion units 93 and 94, a waveform acquisition unit 95, a Fourier transformation unit 96, and a comparison unit 97. The distortion component extraction unit 66 requires high responsiveness enough to detect a distortion component and thus is designed to have responsiveness (frequency detection performance) higher by at least twice of a basic frequency and prevent waveform distortion and phase changes at a detection portion. In other words, the distortion component extraction unit 66 serves as a unit for detecting a voltage or a power having a frequency response speed higher by at least twice of the basic frequency. The basic frequency is a frequency of a sine wave that is finally generated on the wafer W by correcting the waveform data (frequency $f_0$ defined as a set frequency component in FIG. 2A to be described later).

The power measuring unit 91 is connected to the path (output terminal of the matching unit 63 in the example shown in FIG. 1) between the high frequency generation unit 61 and the lower electrode 18 via a directional coupler 91a. The directional coupler 91a extracts the high frequency for plasma generation which is directed toward the lower electrode 18 and outputs the extracted high frequency for plasma generation to the power measuring unit 91. The power measuring unit 91 measures the power of the high frequency for plasma generation which is inputted from the directional coupler 91a (hereinafter, referred to as "high frequency power") and outputs the measured high frequency power to the A/D conversion unit 93.

The power measuring unit 92 is connected to the path (output terminal of the matching unit 63 in the example shown in FIG. 1) between the high frequency generation unit 61 and the lower electrode 18 via a directional coupler 92a. The directional coupler 92a extracts a reflection wave obtained by reflection of the high frequency for plasma generation against the plasma and outputs the extracted reflection wave to the power measuring unit 92. The power measuring unit 92 measures the power of the reflection wave inputted from the directional coupler 92a (hereinafter, referred to as "reflection wave power") and outputs the measured reflection wave power to the A/D conversion unit 94.

The A/D conversion unit 93 performs A/D conversion on the high frequency power inputted from the power measuring unit 91 and outputs the obtained digital high frequency power to the waveform acquisition unit 95.

The A/D conversion unit 94 performs A/D conversion on the reflection wave power inputted from the power measuring unit 92 and outputs the obtained digital reflection wave power the waveform acquisition unit 95.

The waveform acquisition unit 95 acquires a waveform of the high frequency power or that of a difference between the high frequency power and the reflection wave power (i.e., the high frequency power–the reflection wave power). The difference between the high frequency power and the reflection wave power indicates a high frequency power actually absorbed by a plasma and referred to as "effective absorbed power". The waveform of the high frequency power or that of the effective absorbed power substantially coincides with a voltage waveform of the high frequency applied to the lower electrode 18. Therefore, the waveform of the high frequency power or the effective absorbed power includes a distortion component given to the high frequency for plasma generation on the path between the high frequency generation unit 61 and the lower electrode 18.

The Fourier transformation unit 96 extracts a plurality of frequency components included in the waveform acquired by the waveform acquisition unit 95 by performing Fourier transformation on the corresponding waveform and outputs the extracted frequency components to the comparison unit 97.

The comparison unit 97 receives input of the frequency components included in the waveform from the Fourier transformation unit 96. The comparison unit 97 already has information on the set frequency component included in the waveform data generated by the waveform data generation unit 71. The comparison unit 97 extracts, as distortion components, frequency components other than the set frequency component and outputs the extracted distortion components to the waveform correction unit 67.

The waveform correction unit 67 corrects the waveform data used for generation of a high frequency in the high frequency generation unit 61, i.e., the waveform data generated by the waveform data generation unit 71. Specifically, the waveform correction unit 67 obtains an antiphase component by inverting the phase of the distortion component inputted from the comparison unit 97 of the distortion component extraction unit 66. Further, the waveform correction unit 67 corrects the waveform data generated by the waveform data generation unit 71 by combining the antiphase component of the distortion component and the set frequency component of the corresponding waveform data. The waveform data corrected by the waveform correction unit 67 (hereinafter, referred to as "corrected waveform data") includes the antiphase component of the distortion component in addition to the set frequency component. Therefore, the high frequency generated by the high frequency generation unit 61 by using the corrected waveform data includes the antiphase component of the distortion component in addition to the set frequency component.

FIGS. 2A and 2B explain exemplary processes of the distortion component extraction unit 66 and the waveform correction unit 67 in the first embodiment. The right-hand graph of FIG. 2A shows a set frequency component included in the waveform data used for generation of a high frequency in the high frequency generation unit 61 (i.e., the waveform data generated by the waveform data generation unit). The comparison unit 97 of the distortion component extraction unit 66 already has information on the set frequency component shown in the right-hand graph of FIG. 2A. The left-hand graph of FIG. 2A shows a plurality of frequency components extracted by the Fourier transformation unit 96 (i.e., a plurality of frequency components included in the waveform of the high frequency power or in the waveform of the effective absorbed power).

As shown in the left-hand graph of FIG. 2A, the frequency components extracted by the Fourier transformation unit 96 include the harmonic wave distortion and the intermodulation distortion in addition to the set frequency component. In the example shown in FIG. 2A, on the assumption that the frequency of the set frequency component (i.e., frequency of the high frequency for plasma generation which is generated by the high frequency generation unit 61) is $f_0$, the harmonic wave distortion occurs at a frequency of $2f_0$ and a frequency of $3f_0$. Further, on the assumption that the frequency of the bias power high frequency generated by the high frequency power supply 64 is $f_1$, the intermodulation distortion occurs at a frequency of $f_0 \pm f_1$ and a frequency of $f_0 \pm 2f_1$. The comparison unit 97 of the distortion component extraction unit 66 extracts, as distortion components, the harmonic wave distortion and the intermodulation distortion that are the frequency components other than the set frequency component by comparing the frequency components shown in The left-hand graph of FIG. 2A and the set frequency component shown in The right-hand graph of FIG. 2A. The waveform correction unit 67 obtains an antiphase component of the harmonic wave distortion and an antiphase component of the intermodulation distortion by inverting the phases of the harmonic wave distortion and the intermodulation distortion which are extracted as the distortion components. Further, the waveform distortion unit 67 corrects the waveform data used for generation of a high frequency in the high frequency generation unit 61 (i.e., waveform data generated by the waveform data generation unit 71) by combining the antiphase component of the harmonic wave distortion and that of the intermodulation distortion and the set phase component of the corresponding waveform data. The corrected waveform data includes the antiphase component of the harmonic wave distortion and that of the intermodulation distortion in addition to the set frequency component. Therefore, as shown in FIG. 2B, the high frequency generated by the high frequency generation unit 61 by using the corrected waveform data includes the antiphase component of the harmonic wave distortion and that of the intermodulation distortion in addition to the set frequency component.

Figures 3A, 3B:
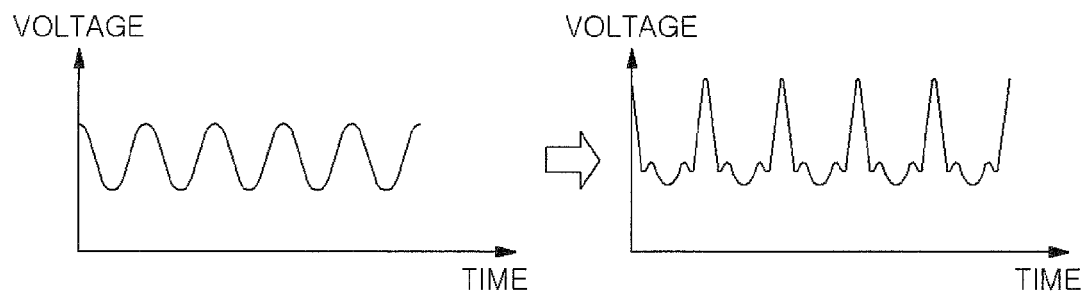
FIGS. 3A and 3B show an example of a result of simulation of a voltage waveform of a lower electrode before correction of waveform data by the waveform correction unit.
Figures 4A, 4B:
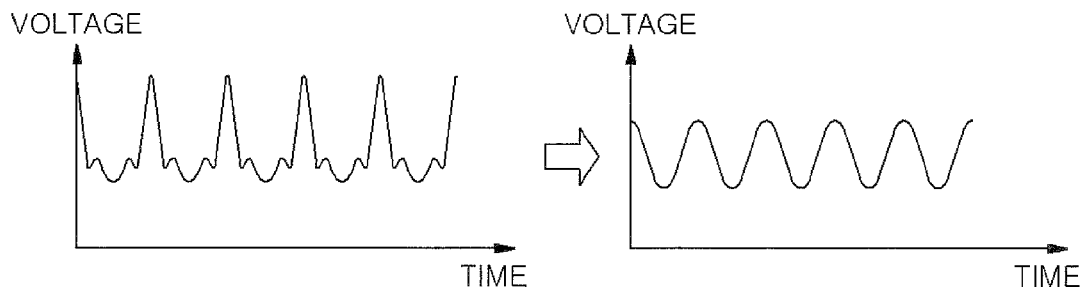
FIGS. 4A and 4B show an example of a result of simulation of a voltage waveform of the lower electrode after the correction of the waveform data by the waveform correction unit.

Hereinafter, results of simulations of the correction of the waveform data by the waveform data correction unit 67 will be described with reference to FIGS. 3A, 3B, 4A and 4B. FIGS. 3A and 3B show exemplary results of the simulations of the voltage waveform of the lower electrode 18 before the correction of the waveform data by the waveform correction unit 67. FIGS. 4A and 4B show exemplary results of the simulations of the voltage waveform of the lower electrode 18 after the correction of the waveform data by the waveform correction unit 67.

FIG. 3A shows a voltage waveform of the high frequency generated by the high frequency generation unit 61 by using the waveform data that is not corrected by the waveform correction unit 67. FIG. 3B shows a voltage waveform of a high frequency applied to the lower electrode 18 in the case of generating the high frequency having the voltage waveform shown in FIG. 3A by the high frequency generation unit 61. FIG. 4A shows a voltage waveform of a high frequency generated by the high frequency generation unit 61 by using the waveform data corrected by the waveform correction unit 67. FIG. 4B shows a voltage waveform of a high frequency applied to the lower electrode 18 in the case of generating the high frequency having the voltage waveform shown in FIG. 4A by the high frequency generation unit 61. In FIGS. 3A to 4B, the horizontal axis represents time and the vertical axis represents a voltage of a high frequency.

Referring to the simulation result shown in FIGS. 3A and 3B, when the waveform data is not corrected by the waveform correction unit 67, the voltage waveform of the high frequency generated by the high frequency generation unit 61 is a sine wave. Further, when the waveform data is not corrected by the waveform correction unit 67, the voltage waveform of the high frequency applied to the lower electrode 18 is distorted. In other words, when the waveform data is not corrected by the waveform correction unit 67, the distortion component is given to the high frequency for plasma generation on the path between the high frequency generation unit 61 and the lower electrode 18 and, thus, the high frequency applied to the lower electrode 18 has a distorted waveform.

On the other hand, referring to the simulation result shown in FIGS. 4A and 4B, when the waveform data is corrected by the waveform correction unit 67, the voltage waveform of the high frequency generated by the high frequency generation unit 61 by using the corrected waveform data is distorted. Further, when the waveform data is corrected by the waveform correction unit 67, the voltage waveform of the high frequency applied to the lower electrode 18 is a sine wave. In other words, when the waveform data is corrected by the waveform correction unit 67, the distortion component applied to the high frequency for plasma generation is cancelled by the antiphase component of the distortion component on the path between the high frequency generation unit 61 and the lower electrode 18 and, thus, the waveform distortion of the high frequency applied to the lower electrode 18 is suppressed.

Figure 5:
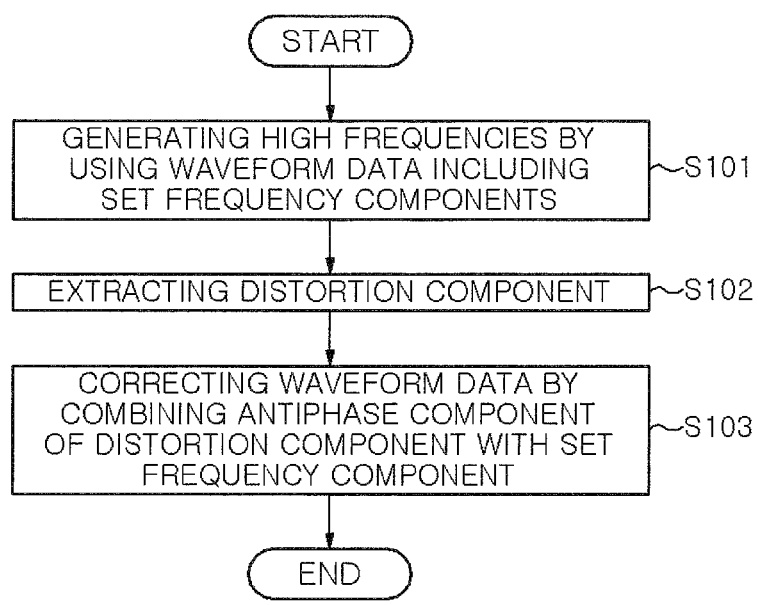
FIG. 5 is a flowchart showing exemplary steps of a waveform correction method according to the first embodiment.

Next, a waveform correction method in the plasma processing apparatus 10 according to the first embodiment will be described. FIG. 5 is a flowchart showing exemplary steps of the waveform correction method according to the first embodiment.

As shown in FIG. 5, the high frequency generation unit 61 of the plasma processing apparatus 10 generates a high frequency by using waveform data including a set frequency component having a predetermined frequency (step S101).

The distortion component extraction unit 66 extracts a distortion component generated on the path for transmitting the high frequency for plasma generation which is generated by the high frequency generation unit 61 to the lower electrode 18 (step S102).

The waveform correction unit 67 corrects the waveform data used for generation of a high frequency in the high frequency generation unit 61 by combining an antiphase component of the distortion component and the set frequency component of the corresponding waveform data (step S103).

In the present embodiment, in the plasma processing apparatus 10 including the lower electrode 18 which serves as the mounting table for the wafer W and to which the high frequency for plasma generation is applied, the waveform data is corrected by generating the high frequency by using the waveform data including the set frequency component having a predetermined frequency, extracting the distortion component generated on the path for transmitting the generated high frequency to the lower electrode 18, and combining the antiphase component obtained by inverting the phase of the distortion component and the set frequency component of the waveform data used for high frequency generation. Accordingly, the distortion component given to the high frequency for plasma generation is cancelled by the antiphase component of the distortion component on the path for transmitting the high frequency to the lower electrode 18 and, thus, the waveform distortion of the high frequency applied to the lower electrode 18 is suppressed. As a result, in the present embodiment, it is possible to suppress deterioration of the etching rate which is caused by the waveform distortion of the high frequency applied to the lower electrode 18 and a difference in the etching rate between the plasma processing apparatuses 10.

Figure 6A:
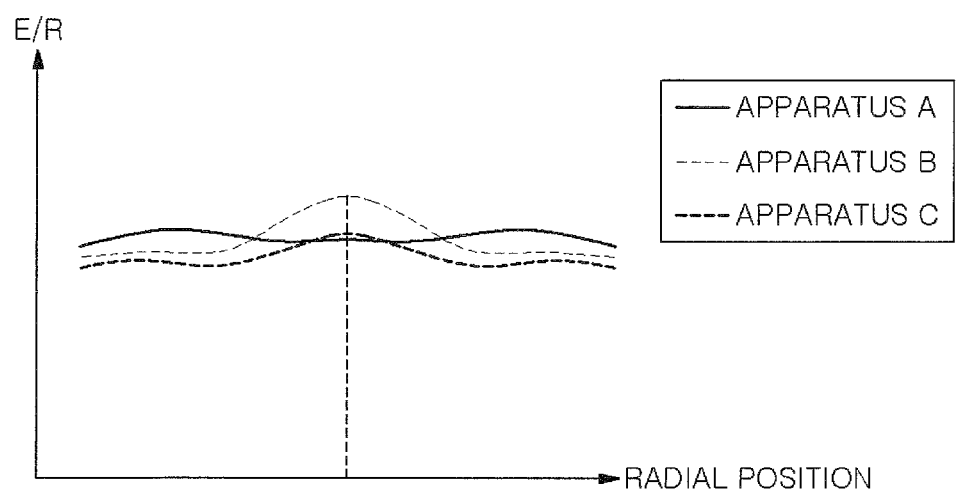
FIGS. 6A and 6B explain an effect of the waveform correction method according to the first embodiment.
Figure 6B:
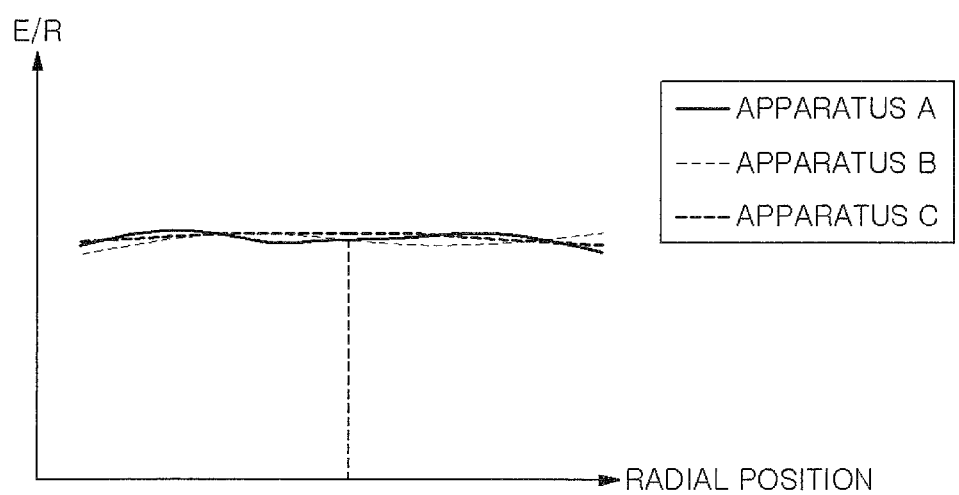

Next, an effect of the waveform correction method of the present embodiment will be further described. FIGS. 6A and 6B explain the effect of the waveform correction method according to the first embodiment. In FIGS. 6A and 6B, the horizontal axis represents a diametrical position with respect to a central position "0" of the wafer W, and the vertical axis represents an etching rate E/R of the wafer W. FIG. 6A shows relation between the diametrical position of the wafer W and the etching rate of the wafer W in the case of performing the plasma etching process on the wafer W without using the waveform correction method of the present embodiment in apparatuses A to C. FIG. 6B shows relation between the diametrical position of the wafer W and the etching rate of the wafer W in the case of performing the plasma etching process on the wafer W using the waveform correction method of the present embodiment in the apparatuses A to C.

As shown in FIG. 6A, when the waveform correction method of the present embodiment was not used, the uniformity of the etching rate of the wafer W in the apparatuses A to C relatively was deteriorated and the difference in the etching rate between the apparatuses A and B was increased.

On the contrary, when the waveform correction method of the present embodiment was used, the waveform data was corrected by generating the high frequency by using the waveform data including the set frequency component having a predetermined frequency, extracting the distortion component generated on the path for transmitting the generated high frequency to the lower electrode 18, and combining the antiphase component obtained by inverting the phase of the distortion component and the set frequency component of the waveform data used for high frequency generation. As a result, as shown in FIG. 6B, when the waveform correction method of the present embodiment was used, the uniformity of the etching rate of the wafer W in the apparatuses A to C was improved, and the difference in the etching rate of the wafer W between the apparatuses A and B was decreased.

Second Embodiment

A second embodiment is different from the first embodiment in that when the distortion component is extracted, the waveform is acquired by measuring a voltage value of the lower electrode 18 instead of the high frequency power or the effective absorbed power. In the following description, like reference numerals will be used for like parts of the first embodiment and redundant description thereof will be omitted.

Figure 7:
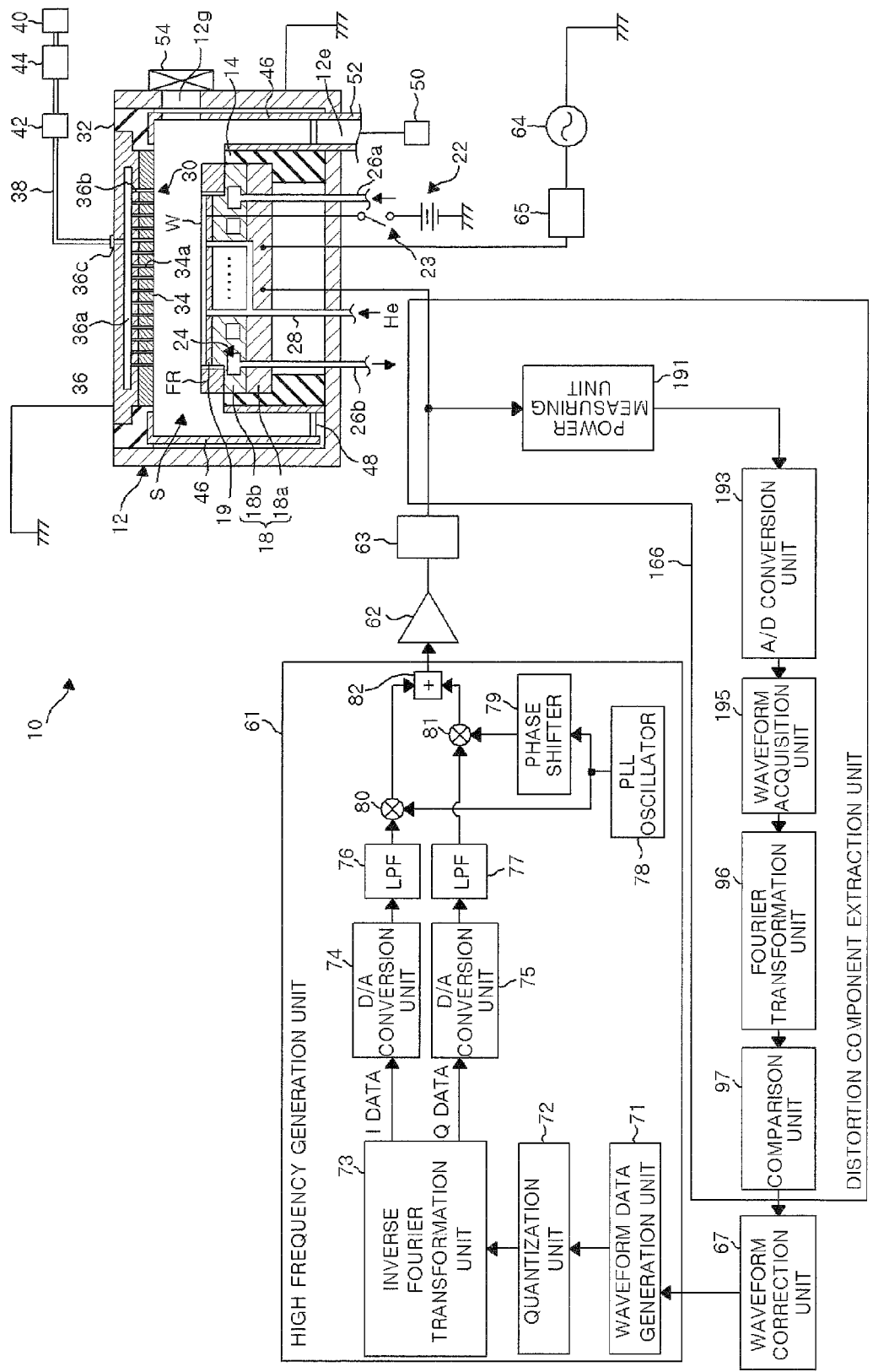
FIG. 7 shows a configuration example of a plasma processing apparatus according to a second embodiment.

FIG. 7 shows a configuration example of a plasma processing apparatus 10 according to the second embodiment. As shown in FIG. 7, the plasma processing apparatus 10 includes a distortion component extraction unit 166. The distortion component extraction unit 166 has a voltage measuring unit 191, an A/D conversion unit 193, a waveform acquisition unit 195, a Fourier transformation unit 96, and a comparison unit 97.

The voltage measuring unit 191 measures a voltage value of the lower electrode 18. Specifically, the voltage measuring unit 191 measures a voltage on the path for transmitting the high frequency generated by the high frequency generation unit 61 to the lower electrode 18 (i.e., the path between the high frequency generation unit 61 and the lower electrode 18) (hereinafter, referred to as "path voltage") as a self-bias voltage Vdc of the lower electrode 18. Further, the voltage measuring unit 191 outputs the measured path voltage to the A/D conversion unit 193.

The A/D conversion unit 193 performs A/D conversion of the path voltage inputted from the voltage measuring unit 191 and outputs the obtained digital voltage to the waveform acquisition unit 195.

The waveform acquisition unit 195 acquires a waveform of the voltage value of the lower electrode 18, i.e., the path voltage. The waveform of the path voltage substantially coincides with the voltage waveform of the high frequency applied to the lower electrode 18. Therefore, the waveform of the path voltage includes the distortion component given to the high frequency for plasma generation on the path between the high frequency generation unit 61 and the lower electrode 18.

As described above, in the present embodiment, when the distortion component is extracted, the waveform of the voltage value of the lower electrode (i.e., the path voltage) is acquired. As a result, in the present embodiment, as in the first embodiment, it is possible to suppress the deterioration of the uniformity of the etching rate which is caused by the waveform distortion of the high frequency applied to the lower electrode 18 and the difference in the etching rate between the apparatuses.

Third Embodiment

A third embodiment is different from the second embodiment in that a voltage of the electrostatic chuck 19 is measured as a voltage value of the lower electrode 18 and a waveform of the voltage of the electrostatic chuck 19 is acquired. In the following description, like reference numerals will be used for like part of the second embodiment and redundant description thereof will be omitted.

Figure 8:
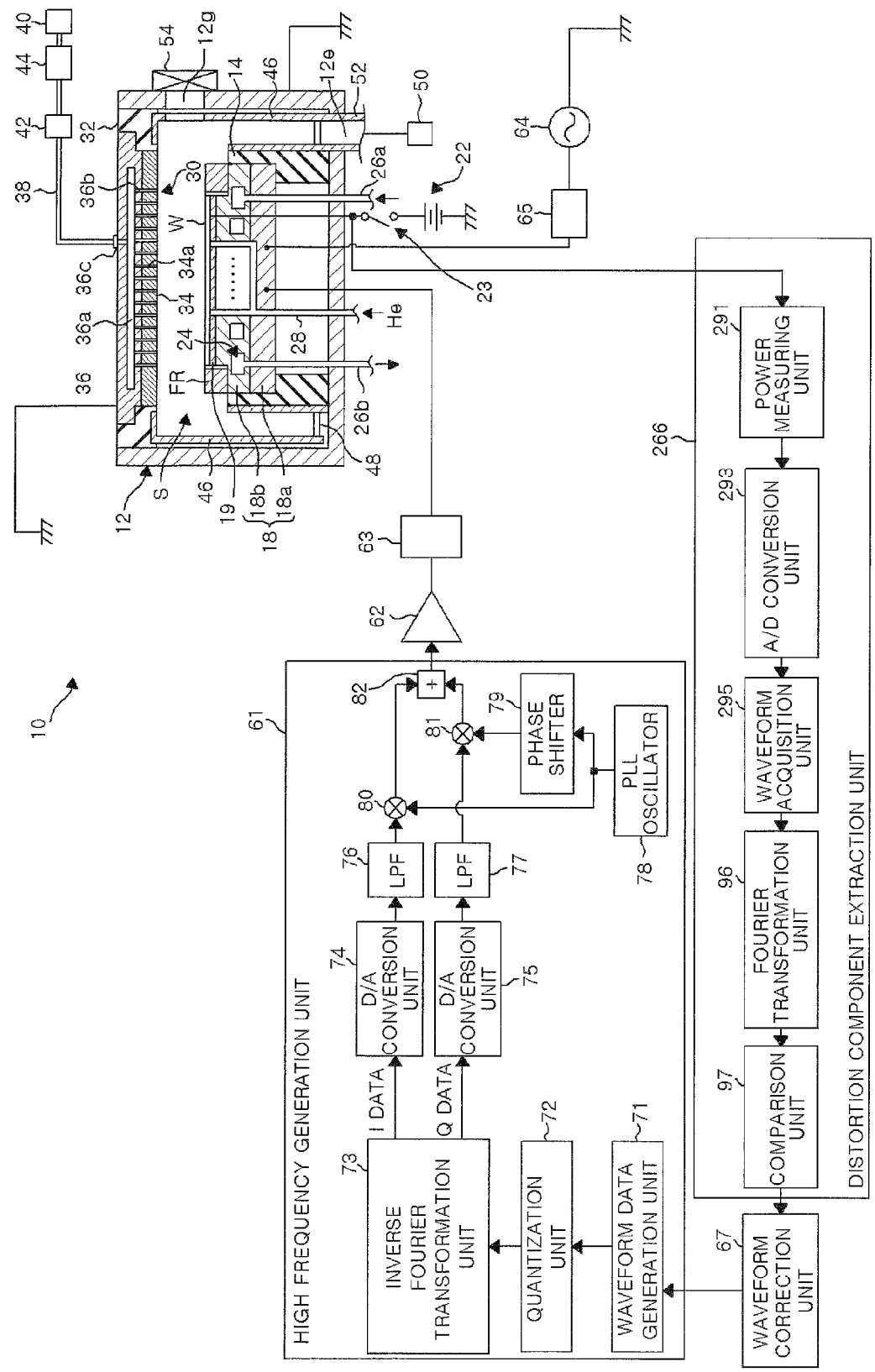
FIG. 8 shows a configuration example of a plasma processing apparatus according to a third embodiment.

FIG. 8 shows a configuration example of a plasma processing apparatus 10 according to the third embodiment. As shown in FIG. 8, the plasma processing apparatus 10 includes a distortion component extraction unit 266. The distortion component extraction unit 266 has a voltage measuring unit 291, an A/D conversion unit 293, a waveform acquisition unit 295, a Fourier transformation unit 96, and a comparison unit 97.

The voltage measuring unit 291 measures a voltage of the electrostatic chuck 19 as a self-bias voltage Vdc of the lower electrode 18. In the example shown in FIG. 8, the voltage measuring unit 291 measures a voltage of the electrostatic chuck 19 in a wiring connecting the electrostatic chuck 19 and the DC power supply 22. Further, the voltage measuring unit 291 outputs the measured voltage of the electrostatic chuck 19 to the A/D conversion unit 293.

The A/D conversion unit 293 performs A/D conversion of the voltage of the electrostatic chuck 19 which is inputted from the voltage measuring unit 291 and outputs the obtained digital voltage to the waveform acquisition unit 295.

The waveform acquisition unit 295 acquires a waveform of the voltage value of the lower electrode 18, i.e., the voltage of the electrostatic chuck 19. The waveform of the voltage of the electrostatic chuck 19 substantially coincides with the voltage waveform of the high frequency applied to the lower electrode 18. Therefore, the waveform of the voltage of the electrostatic chuck 19 includes the distortion component given to the high frequency for plasma generation on the path between the high frequency generation unit 61 and the lower electrode 18.

As described above, in the present embodiment, when the distortion component is extracted, the waveform of the voltage value of the lower electrode 18 (i.e., the voltage of the electrostatic chuck 19) is acquired. As a result, in the present embodiment, as in the second embodiment, it is possible to suppress the deterioration of the uniformity of the etching rate which is caused by the waveform distortion of the high frequency applied to the lower electrode 18 and the difference in the etching rate between the apparatuses.

Fourth Embodiment

A fourth embodiment is different from the second embodiment in that a voltage of a focus ring FR is measured as a voltage value of the lower electrode 18 and a waveform of the voltage of the focus ring FR is acquired. In the following description, like reference numerals will be used for like parts of the second embodiment, and redundant description thereof will be omitted.

Figure 9:
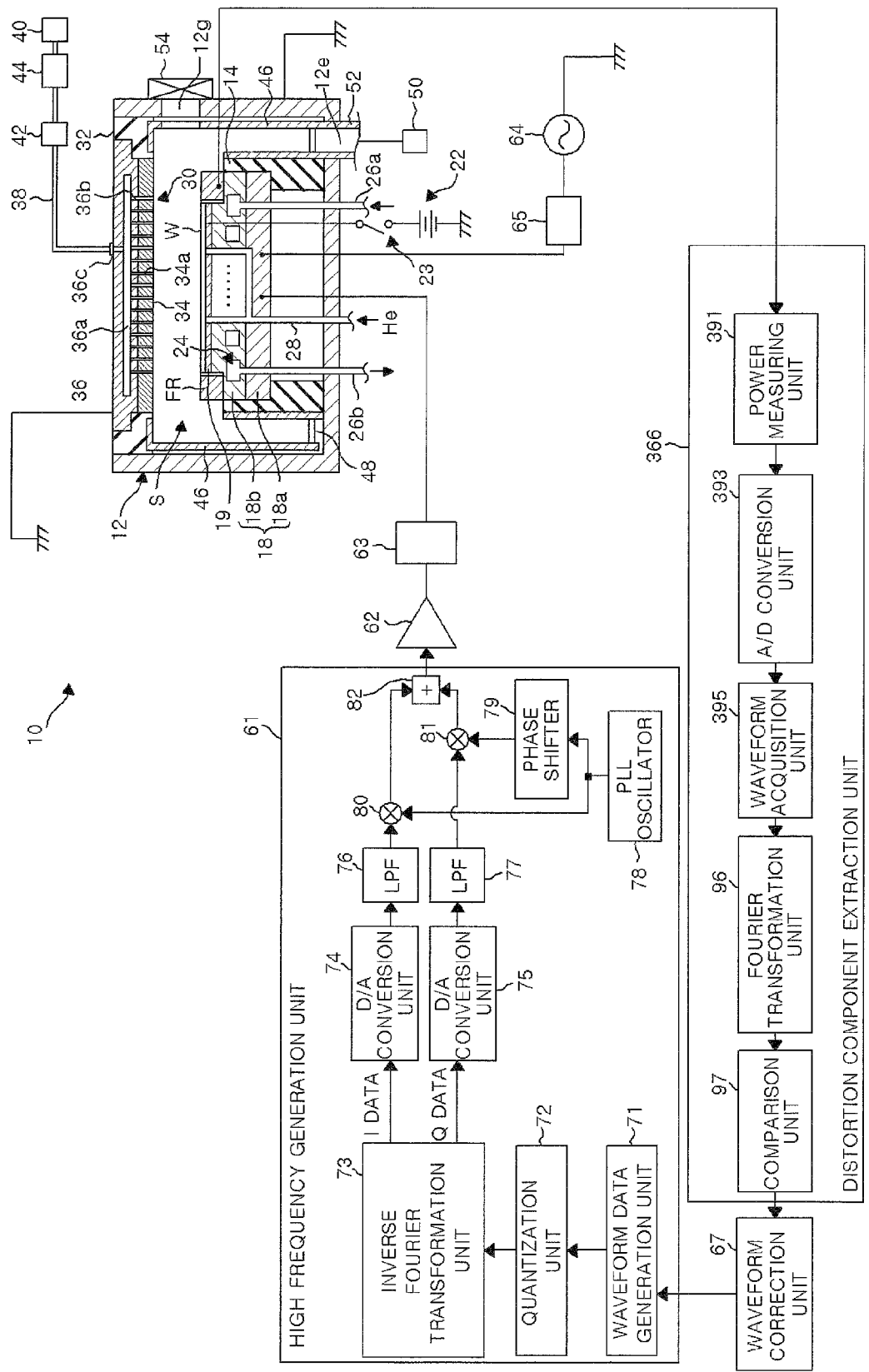
FIG. 9 shows a configuration example of a plasma processing apparatus according to a fourth embodiment.

FIG. 9 shows a configuration example of a plasma processing apparatus 10 according to the fourth embodiment. As shown in FIG. 9, the plasma processing apparatus 10 includes a distortion component extraction unit 366. The distortion component extraction unit 366 has a voltage measuring unit 391, an A/D conversion unit 393, a waveform acquisition unit 395, a Fourier transformation unit 96, and a comparison unit 97.

The voltage measuring unit 391 measures a voltage value of the focus ring FR and outputs the measured voltage of the focus ring FR to the A/D conversion unit 393.

The A/D conversion unit 393 performs A/D conversion of the voltage of the focus ring FR which is inputted from the voltage measuring unit 391 and outputs the obtained digital voltage to the waveform acquisition unit 395.

The waveform acquisition unit 395 acquires a waveform of the voltage value of the lower electrode, i.e., the voltage of the focus ring FR. The waveform of the voltage of the focus ring FR substantially coincides with the voltage waveform of the high frequency. Therefore, the waveform of the voltage of the focus ring FR includes the distortion component given to the high frequency for plasma generation on the path between the high frequency generation unit 61 and the lower electrode 18.

As described above, in the present embodiment, when the distortion component is extracted, the waveform of the voltage value of the lower electrode 18 is acquired. As a result, in the present embodiment, as in the second embodiment, it is possible to suppress the deterioration of the uniformity of the etching rate which is caused by the waveform distortion of the high frequency applied to the lower electrode 18 and the difference in the etching rate between the apparatuses.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus including an electrode to which a high frequency for plasma generation is applied and which serves as a mounting table for a target object, the apparatus comprising:
a high frequency generation unit configured to generate the high frequency by using waveform data including a set frequency component having a predetermined frequency;
a distortion component extraction unit configured to extract a distortion component given to the high frequency in a path for transmitting the high frequency generated by the high frequency generation unit to the electrode; and
a waveform correction unit configured to correct the waveform data by combining an antiphase component obtained by inverting a phase of the distortion component and the set frequency component of the waveform data used for generation of the high frequency.

2. The plasma processing apparatus of claim 1, wherein the distortion component extraction unit includes:
a waveform acquisition unit configured to acquire a waveform of a power of the high frequency applied to the electrode, a difference between the power of the high frequency and power of a reflection wave obtained by the high frequency being reflected by a plasma, or a voltage value of the electrode;
a Fourier transformation unit configured to extract a plurality of frequency components included in the waveform by performing Fourier transformation on the waveform; and
a comparison unit configured to extract, as the distortion component, a frequency component other than the set frequency component by comparing the respective frequency components and the set frequency component.

3. The plasma processing apparatus of claim 2, wherein the distortion component extraction unit further includes a voltage measuring unit configured to measure, as the voltage value of the electrode, a voltage of a path for transmitting the high frequency generated by the high frequency generation unit to the electrode, and
the waveform acquisition unit acquires a waveform of the voltage of the path which is measured by the voltage measuring unit.

4. The plasma processing apparatus of claim 2, wherein an electrostatic chuck configured to attract and hold the target object by an electrostatic force is provided on the electrode,
the distortion component extraction unit further includes a voltage measuring unit configured to measure a voltage of the electrostatic chuck as the voltage value of the electrode, and
the waveform acquisition unit acquires a waveform of the voltage of the electrostatic chuck which is measured by the voltage measuring unit.

5. The plasma processing apparatus of claim 2, wherein a focus ring is provided on the electrode to surround a region on which the target object is mounted,
the distortion component extraction unit further includes a voltage measuring unit configured to measure a voltage of the focus ring as the voltage value of the electrode, and
the waveform acquisition unit acquires a waveform of the voltage of the focus ring which is measured by the voltage measuring unit.

6. A waveform correction method in a plasma processing apparatus including an electrode which serves as a mounting table for a target object and to which a high frequency for plasma generation is applied, the method comprising:
generating the high frequency by using waveform data including a set frequency component having a predetermined frequency;
extracting a distortion component given to the high frequency in a path for transmitting the generated high frequency to the electrode; and,
correcting the waveform data by combining an antiphase component obtained by inverting a phase of the distortion component and the set frequency component of the waveform data used for high frequency generation.

* * * * *